US012126300B2

(12) United States Patent
Shugar et al.

(10) Patent No.: US 12,126,300 B2
(45) Date of Patent: Oct. 22, 2024

(54) LIGHT MANAGEMENT SYSTEMS FOR OPTIMIZING PERFORMANCE OF BIFACIAL SOLAR MODULE

(71) Applicant: Nextracker LLC, Fremont, CA (US)

(72) Inventors: Daniel Shugar, Pacifica, CA (US); Eric Cole, Liberty, IL (US)

(73) Assignee: NEXTRACKER LLC, Fremont, CA (US)

( * ) Notice: Subject to any disclaimer, the term of this patent is extended or adjusted under 35 U.S.C. 154(b) by 0 days.

(21) Appl. No.: 17/978,709

(22) Filed: Nov. 1, 2022

(65) Prior Publication Data

US 2023/0051274 A1 Feb. 16, 2023

Related U.S. Application Data

(62) Division of application No. 16/174,006, filed on Oct. 29, 2018, now Pat. No. 11,489,488.

(Continued)

(51) Int. Cl.
*H02S 40/22* (2014.01)
*H02S 20/30* (2014.01)
(Continued)

(52) U.S. Cl.
CPC ............... *H02S 40/22* (2014.12); *H02S 20/30* (2014.12); *H02S 40/20* (2014.12); *H02S 40/36* (2014.12)

(58) Field of Classification Search
CPC .......... H02S 40/22; H02S 20/30; H02S 40/20; H02S 40/36
See application file for complete search history.

(56) References Cited

U.S. PATENT DOCUMENTS 4,414,275 A 11/1983 Woods
4,909,856 A 3/1990 Ralph
(Continued)

FOREIGN PATENT DOCUMENTS

CN 202977490 U * 6/2013
CN 106449842 A 2/2017
(Continued)

OTHER PUBLICATIONS

Asbeck et al., DE102015120521A1, English Machine Translation, pp. 1-27. (Year: 2017).*

(Continued)

*Primary Examiner* — Tae-Sik Kang
(74) *Attorney, Agent, or Firm* — Fredrikson & Byron, P.A.

(57) ABSTRACT

A bifacial solar module with enhanced power output including first and second transparent support layers, a plurality of electrically interconnected bifacial solar cells arranged between the transparent support layers with gaps between one or more of the interconnected solar cells and edges of the first and second transparent support layers, the bifacial solar cells having a first side directly exposed to solar radiation and a second side opposite the first. The bifacial solar module further includes one or more micro-structured reflective tapes positioned coincidentally with the gaps and attached to a surface of the second support layer such that light passing through the second support layer is reflected back into the second support layer at angles such that light reflecting from the tape is absorbed by either the first or second side of the bifacial solar cells.

11 Claims, 14 Drawing Sheets

Related U.S. Application Data

(60) Provisional application No. 62/657,470, filed on Apr. 13, 2018.

(51) Int. Cl.
*H02S 40/20* (2014.01)
*H02S 40/36* (2014.01)

(56) References Cited

U.S. PATENT DOCUMENTS

| | | | |
|---|---|---|---|
| 6,008,449 | A | 12/1999 | Cole |
| 6,133,522 | A | 10/2000 | Kataoka et al. |
| 6,307,145 | B1 | 10/2001 | Kataoka et al. |
| 7,238,878 | B2 | 7/2007 | Gonsiorawski |
| 9,812,590 | B2 | 11/2017 | Kim et al. |
| 2004/0035460 | A1 | 2/2004 | Gonsiorawski |
| 2006/0272698 | A1 | 12/2006 | Durvasula |
| 2008/0000517 | A1 | 1/2008 | Gonsiorawski et al. |
| 2008/0105293 | A1 | 5/2008 | Lu et al. |
| 2008/0105298 | A1 | 5/2008 | Lu et al. |
| 2008/0223436 | A1 | 9/2008 | Boer et al. |
| 2008/0257399 | A1 | 10/2008 | Wong et al. |
| 2010/0024866 | A1* | 2/2010 | Durvasula ........... H01L 31/0547 136/246 |
| 2010/0200063 | A1 | 8/2010 | Djeu |
| 2010/0206352 | A1 | 8/2010 | Gee et al. |
| 2010/0212717 | A1 | 8/2010 | Whitlock et al. |
| 2010/0252107 | A1 | 10/2010 | Suga |
| 2010/0294336 | A1 | 11/2010 | Johnson et al. |
| 2012/0097213 | A1 | 4/2012 | Weidner |
| 2012/0099189 | A1 | 4/2012 | Bezzel et al. |
| 2014/0102531 | A1 | 4/2014 | Moslehi |
| 2014/0332073 | A1 | 11/2014 | Chen et al. |
| 2016/0141435 | A1 | 5/2016 | Sridhara et al. |
| 2017/0104121 | A1 | 4/2017 | O'Neill et al. |
| 2017/0117425 | A1* | 4/2017 | Asbeck ................... H02S 40/22 |
| 2017/0279407 | A1 | 9/2017 | Peharz et al. |
| 2018/0053860 | A1 | 2/2018 | Kim et al. |

FOREIGN PATENT DOCUMENTS

| | | |
|---|---|---|
| DE | 102009019937 A1 | 11/2010 |
| DE | 102013220802 A1 | 4/2015 |
| DE | 102015220799 A1 | 4/2017 |
| DE | 102015120521 A1 * | 6/2017 |
| FR | 3042350 B1 | 3/2018 |
| JP | 2013183128 A | 9/2013 |
| WO | 2015172054 A1 | 11/2015 |
| WO | 2016025969 A1 | 2/2016 |

OTHER PUBLICATIONS

Liu et al., CN 202977490 U, English Machine Translation. (Year: 2013).*
Notice of acceptance issued in Australian Patent Application No. 2019252911 dated Feb. 8, 2023.
Communication pursuant to Article 94(3) EPC issued in European Patent Application No. 19785441.7 dated Mar. 24, 2023.
Examination report issued in Australian Patent Application No. 2019252911 dated Oct. 13, 2022.
Extended European Search Report issued in European Patent Application No. 19785441.7 dated Nov. 29, 2021, 7 pages.
First Examination Report issued in Indian Patent Application No. 202017042743 dated Dec. 9, 2021, 6 pages.
PCT Search Report and Written Opinion issued in corresponding PCT/US19/27278 dated Jul. 2, 2019, 44 pages.

* cited by examiner

Fig. 4A
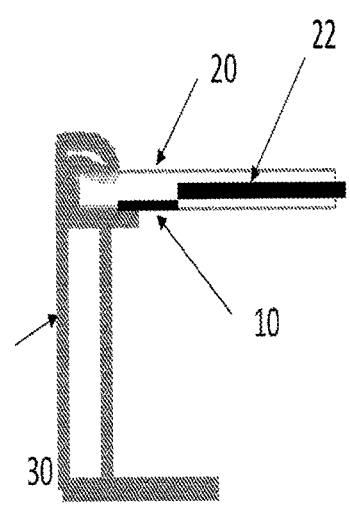
Fig. 4B
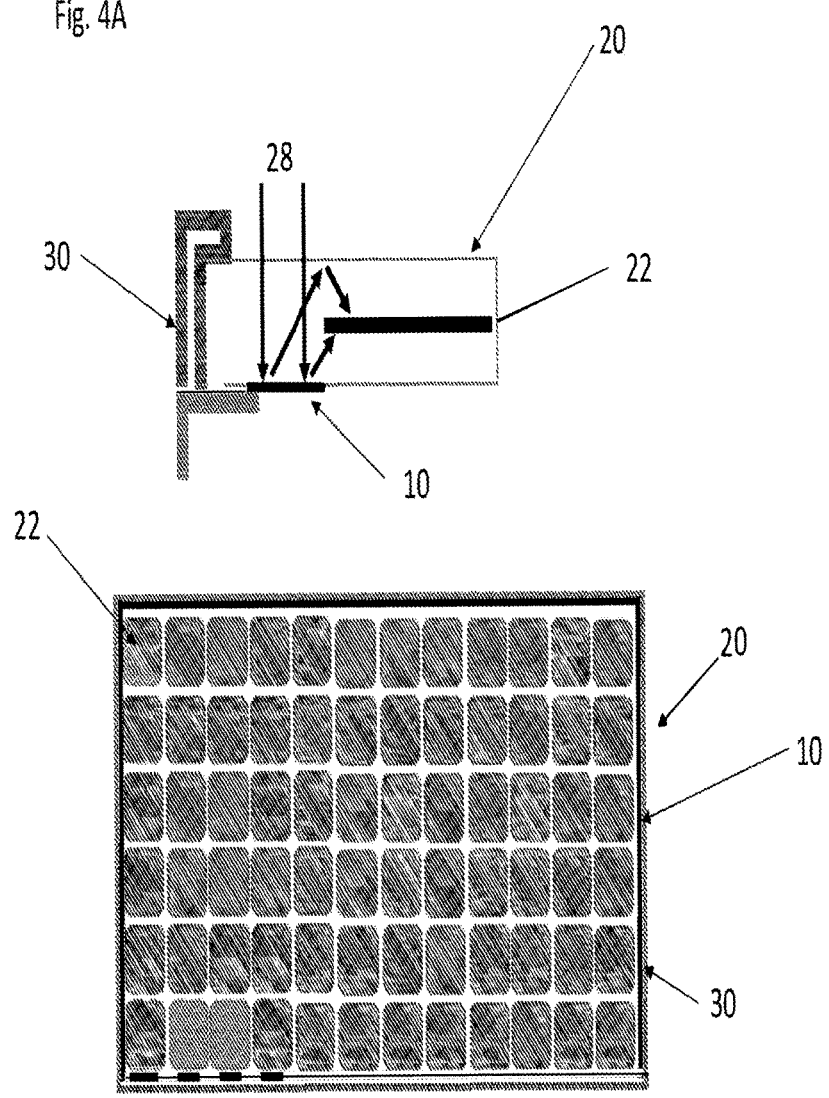
Fig. 4C

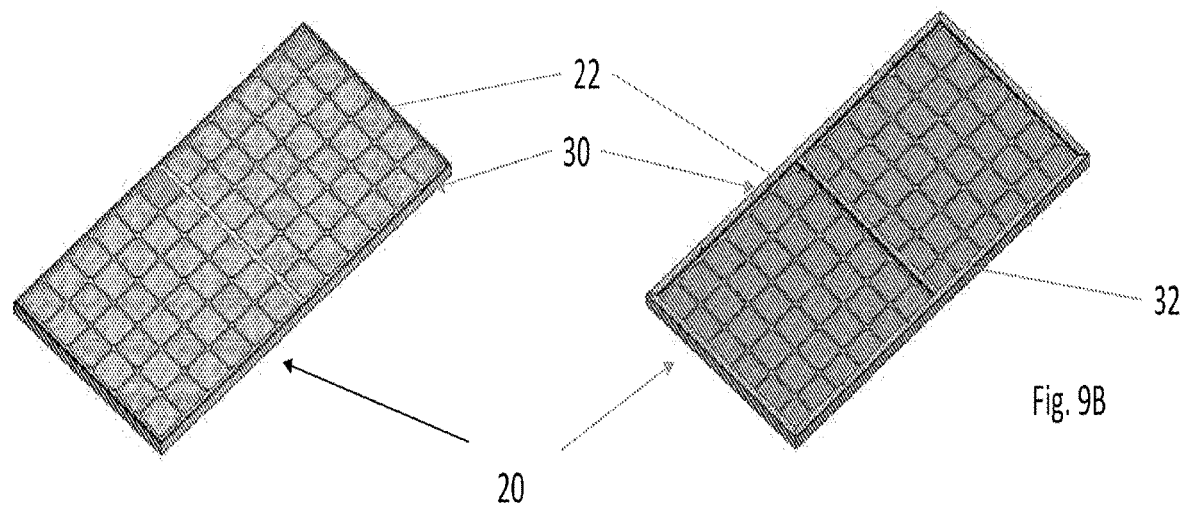
Fig. 9A
Fig. 9B
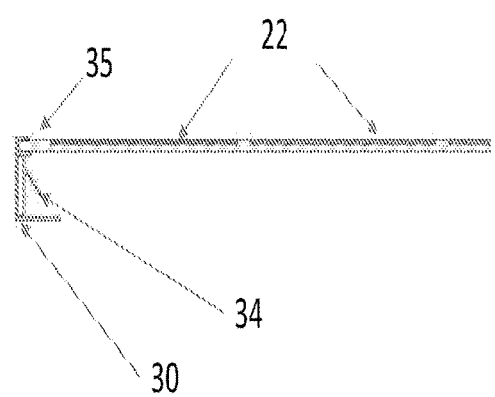
Fig. 9C
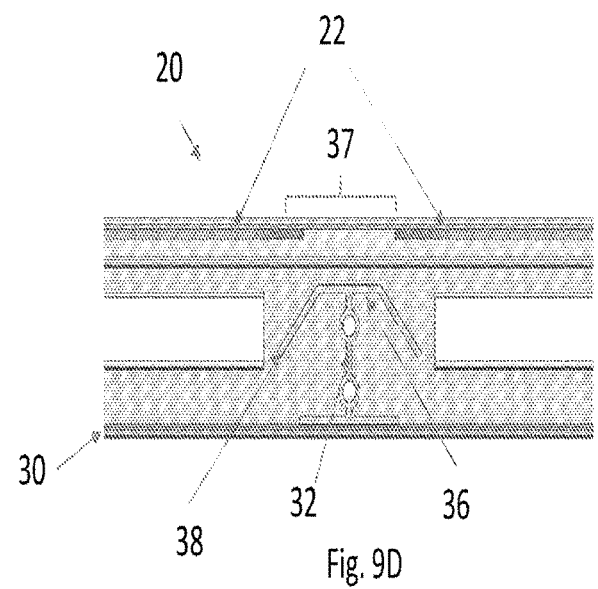
Fig. 9D

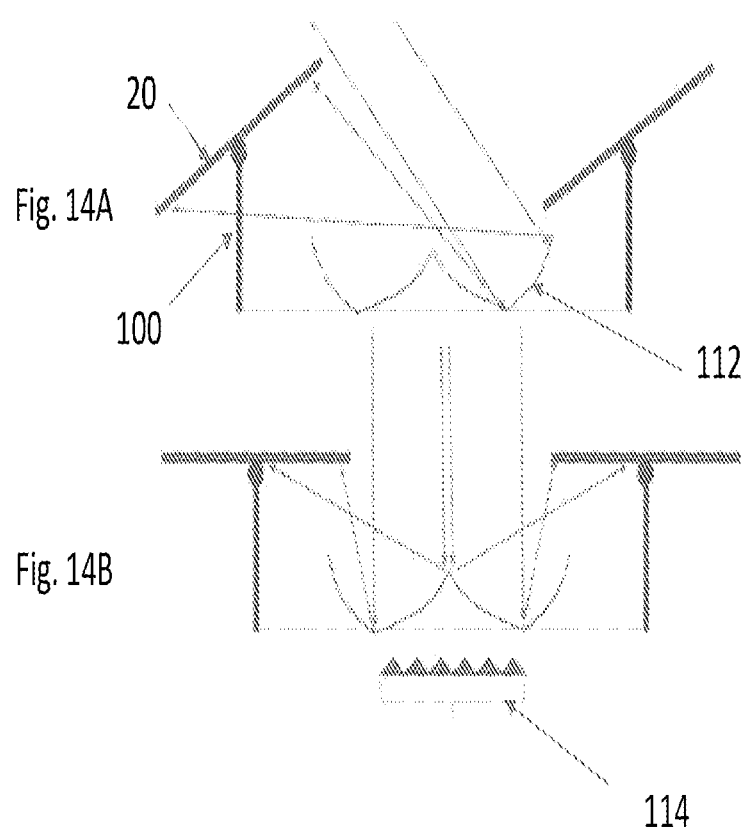

LIGHT MANAGEMENT SYSTEMS FOR OPTIMIZING PERFORMANCE OF BIFACIAL SOLAR MODULE

CROSS-REFERENCE TO RELATED APPLICATIONS

The present application is a divisional of U.S. patent application Ser. No. 16/174,006, filed on Oct. 29, 2018, which claims the benefit of, and priority to, U.S. Provisional Patent Application Ser. No. 62/657,470, filed on Apr. 13, 2018, the entire contents of each of which are hereby incorporated by reference herein.

TECHNICAL FIELD

The present disclosure relates to solar energy production. More specifically a solar module design incorporating light management that increases power output for the same or less amount of silicon solar cells.

BACKGROUND OF THE PRESENT DISCLOSURE

Solar power is accelerating as a mainstream power generation source in global markets. To further broaden its economic value, greater productivity of solar power system is desired by customers. Crystalline solar photovoltaic systems predominantly capture light on the front side of solar panels, on the front "face", which can be considered "monofacial" solar panels. One method to increase power production is to harvest reflected light from the ground on the back side of the solar panels, on to special solar cells, that are designed to harvest "bifacial" energy. Bifacial solar panels have been used in the solar industry for over 10 years.

There are several key limitations on the design of bifacial solar panels that limit their utility. Initially, there is light loss through the solar panel, around the crystalline solar cells, impacted front side power. Typical crystalline modules have significant areas between the cells, that are not covered by active solar cell material. Light entering these zones on a monofacial modules is largely reflected, and scattered, by standard white backsheets, and partially recovered through total internal refection (TIR) onto the front sides of solar cells. On bifacial modules however, this light energy is lost because the backside of the solar panel is transparent, per design, to allow the back of the cells to receive light. While this is necessary for rear side bifaciality, front side power suffers, approximately 3-5%. This is significant loss of power.

A second limitation is caused by lower backside irradiance at the edge of the solar panel due to the partial shading of edge cells from frame profile or mounting rail elements. Frames are desirable to reduce breakage of solar panels, enable a more durable long-term solar panel life, and reduce mounting system costs. However, frames have profiles that extend beyond the lower plane of the module backsheet. As a result, cell columns near the edge of the module receive less light than cells further away from the edge.

A third limitation is a result of lower backside irradiance at the center of the solar panel, impacting the center rows of cells, due to the reduced availability of reflected light on the center rows of cells, attributable to the geometric relationship of incoming reflected light biased away from center cells rows, and/or attributable to rear structure tube below the module center that reduce the total light available to those center cell rows.

In addition to the foregoing, tracking systems are often utilized with solar modules to reduce cosine losses from the angular displacement of the panels with the incident sun angle over the course of a day. These systems consist of either one- or two-dimensional systems, single axis or double axis respectively, which direct the panels normal to incident sun rays. In either case the tracking imposes limitations on the system output per land area due to self-shading necessitating placement of panels in arrays with dead spaces where light is not directly incident on surrounding panels. To recover some of these losses, bifacial solar modules can be used to recapture light falling between the system rows via diffuse collection of ground reflected light to the panel back side for further power generation. However, the diffuse reflections from the surrounding ground area are much less than optimal due to absorption and randomly directed rays away from solar panel absorption. This reduction in power can negate the power enhancements available to bifacial solar modules.

The present disclosure addresses all these shortcomings of the known systems.

SUMMARY OF THE PRESENT DISCLOSURE

A bifacial solar panel array provides an opportunity for enhanced collection of solar energy these dead spaces using specific reflecting surfaces. One aspect of the present disclosure describes systems and methods for increasing power output from a solar module containing bifacial solar cells by applying light management films to the exterior, preferably back surface, of the module which causes direct and total internal reflection in the module to redirect light from blank regions between the cells back to both active cell surfaces, cell front and back junctions. Because large areas can be redirected, it is also advantageous to increase the gaps between cells or use fractional cells to create a concentration ratio greater than one for the module.

One aspect of the present disclosure is directed to a bifacial solar module with enhanced power output including first and second transparent support layers, a plurality of electrically interconnected bifacial solar cells arranged between the first and second transparent support layers with gaps between one or more of the interconnected solar cells and edges of the first and second transparent support layers, the bifacial solar cells having a first side directly exposed to solar radiation and a second side opposite the first, and one or more micro-structured reflective tapes positioned coincidentally with the gaps and attached to a surface of the second support layer such that light passing through the second support layer is reflected back into the second support layer at angles such that light reflecting from the tape is absorbed by either the first or second side of the bifacial solar cells.

The micro-structured reflective tape may be adhered to the second transparent support layer with a UV curable adhesive material or with an acrylic material. The adhesive may be pre-attached to the micro-structured reflective tape prior to application to second transparent support layer.

In accordance with one aspect of the present disclosure, the micro-structured reflective tape includes prisms positioned against the second transparent support layer. Alternatively, the micro-structured reflective tape may include prisms positioned on rear side of the tape away from a surface the second transparent support layer.

With respect to one aspect, the micro-structured reflective tape reflects light directly into second side of the bifacial cells. The micro-structured reflective tape may also reflect light into the second side of the bifacial solar cells and at an angle enough to totally internally reflect off the first transparent support layer down on to the front surface of the bifacial cells. In one aspect of the disclosure at least a portion of light totally internally reflected off the first transparent support layer is further totally internally reflected off the second transparent support layer and onto the second side of the bifacial solar cells.

In accordance with the present disclosure, micro-structured reflective tape includes prisms having a plurality of prism angles. The plurality of prism angles reflect light at different angles to impact the first or second side of the bifacial solar cells. Further the gap occupies the perimeter of the bifacial cells and the micro-structured reflective tape includes prism angles set to maximize light from the perimeter gap.

In one aspect of the disclosure, the gap is 1-300 mm wide across a centerline of the first and second transparent support layers dividing the plurality of bifacial cells into two electrically interconnected regions. The bifacial solar cells may be cut to less than whole cells and may be electrically integrated to form two series interconnected groups of cells, each of these two groups connected in parallel within the same module.

In accordance with the present disclosure, the first and second transparent support layers are glass or a polymer. Further, the micro-structured reflective tape includes prisms arranged in two or more zones across the tape. Moreover, the prism shapes within each zone may be substantially the same and at least two zones may have prisms formed with different angles for reflecting the solar radiation.

BRIEF DESCRIPTION OF DRAWINGS

FIGS. 4A-4C depicts a reflective tape at edges and gaps between cells on a solar module;

FIGS. 9A-9F depict a solar module and components with a reflective component of the present disclosure;

FIG. 14A depicts a ground based static reflector for a bi-facial array in accordance with the present disclosure in a first orientation; and FIG. 14B depicts a ground based static reflector for a bi-facial array in accordance with the present disclosure in a second orientation.

DETAILED DESCRIPTION OF THE PRESENT DISCLOSURE

The present disclosure is directed to systems and methods for increasing the energy yield of bi-facial solar modules. In accordance with certain aspects of the present disclosure, the bi-facial solar modules are employed with single axis solar tracker devices, however, other applications are considered within the scope of the present disclosure, including fixed position installations dual axis solar trackers and others.

Figure 1:
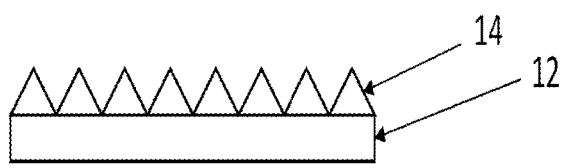
FIG. 1 depicts a reflective tape in accordance with the present disclosure.
Figure 2A:
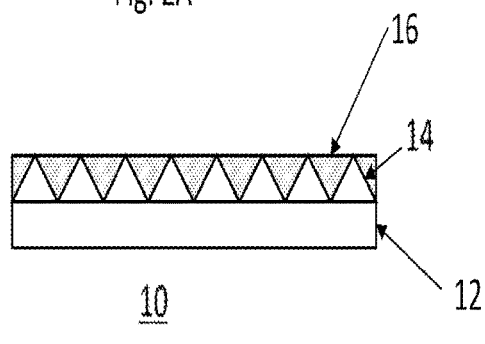
FIGS. 2A and 2B depict a reflective tape of FIG. 1 with adhesive applied to one side of the tape in accordance with the present disclosure.
Figure 2B:
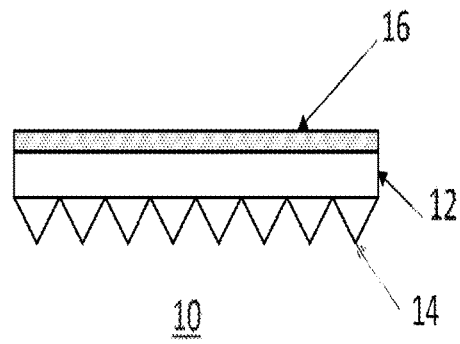

FIG. 1 shows a micro-structured reflective tape 10 in accordance with the present disclosure. The reflective tape 10 includes a polymer carrying film 12 and UV prisms 14 formed on one surface of the film. In at least one embodiment of the present disclosure blank spaces between bifacial solar cells of a solar module are covered on the back surface of the module by one or more of these micro-structured reflective tapes 10. The reflective tapes 10 are designed to return light to the active surfaces of the solar cells by both direct and total internal reflective means, as will be described in connection with FIG. 3. The surfaces of the prism 14 may be coated with reflective materials to provide efficient reflection of incident light. As shown in FIGS. 2A and 2B the films 10 may have optically clear adhesives 16 applied either to the polymer film 12 or the prisms 14 for adhesion to the underside of the solar module. While application of the adhesive on the prism may provide for a lower profile and less snag likely solution, greater care must be taken in the application of the adhesives to the reflective tape 10 to ensure that no bubbles form and that enough adhesive is present to ensure good adhesion to the solar module. Further, in this embodiment the polymer film is not exposed to direct solar radiation, which may provide some durability benefits. Alternatively, application of the adhesive to the polymer film 14 may provide some manufacturing benefits at the potential cost of some reduction in reflective capabilities owing to the need for the polymer film to also be translucent and still reliable despite exposure to solar radiation. The optically clear adhesives 16, as well as the polymer film 12 may have a refractive index nearly equal to the transparent or translucent back sheet of the solar module. Alternatively, other refractive indices can be used for the adhesives or polymer films to provide additional optical effects. The adhesives 16 may be UV curable and may further be acrylics.

In a further embodiment related to the embodiment of FIG. 2A the polymer film 12 may be removed from the prisms 14 after adhesion of the adhesive 16 to the solar module. Further, in general the optically clear adhesive should fill between 90-100% of air gaps between the prims 14 or polymer film 12 and the back sheet of the solar module 20. The prisms 14 preferably has a plurality of coplanar prisms with slope angle between 1 and 45 degrees and draft angle between 45 and 90 degrees and a height between 1 and 1000 microns. Further, the prisms 14 may be coated with a highly reflective material. Still further the micro-structured reflective tape prisms 14 may be formed using UV curable polymers or thermal embossing. Still further, the micro-structured reflective tape prisms 14 may be are formed on a polymer base tape 12 which is separated and removed from said prisms 14 after adhesion to the rear side of glass 24 (FIG. 3).

Figure 3:
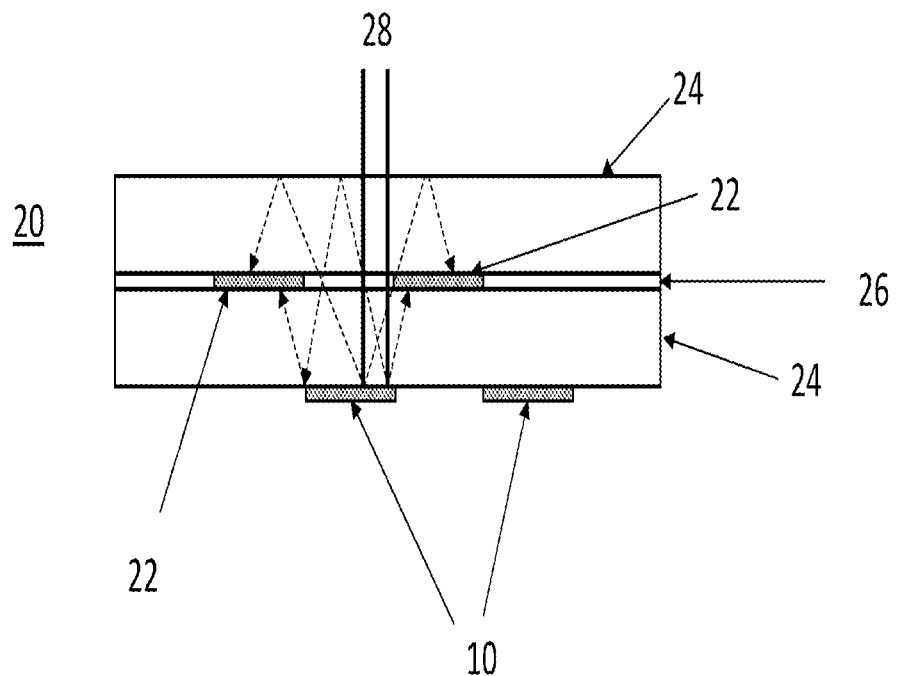
FIG. 3 depicts a gap in the center of a solar module and solar radiation reflecting off a reflective tape of FIG. 1.

FIG. 3 depicts the use of the reflective tapes applied to a back surface of a solar module 20. The solar module 20 includes two solar cells 22 trapped between two glass sheets 24 and embedded in a bedding material 26 such as Ethylene-vinyl acetate (EVA). Sunlight, graphically shown as lines 28, impact the solar module 20 and pass through the glass 24 and EVA 26. Without the reflective tapes 10, this sunlight would pass completely through the module 20 and the vast majority of its energy would be lost to heating the air on the opposite side of the solar module.

In the embodiment of FIG. 3, the sunlight 28 impacts the reflective tapes 10 and is redirected back towards the solar cells 22. Some of this reflected light is reflected directly back to the underside of the solar cells 22 and is absorbed there. Other components of the reflected light back into the glass 24 and again reflected back towards either the front side of the solar cell 22 by the total internal refection (TIR), or in fact reflected multiple times, a first time by the reflective tape 10, a second time by the TIR of the glass 24, and then a third time by the reflective tape 10 before achieving an angle of reflection which impacts the solar cell 22 and is absorbed. All these paths can be seen in the reflective paths in FIG. 3 depicted as dashed lines.

One of the advantages of applying the reflective films to the outside of the module is that the reflective films 10 can avoid the high heat of the lamination process used to construct the solar module itself. This allows for simple incorporation into the module process with little impact on the module line itself and even aftermarket retro-fit of existing solar modules to achieve some if not all the herein contemplated increases in energy production.

FIG. 4A shows a further application of the reflective tape 10 along a gap at the edge of the solar module 20. The solar module 20 is secured within an aluminum frame 30 which is common to solar modules. The reflective tape 10 located at the gap can reflect to the edge cells of the solar module 20 which might be in some instances be shaded by the frame 30. As is well known shading reduces overall module output. The reflective tape 1—at the edge can redirect the sunlight 28 which would normally be lost into the backside of the solar module (or the front side) to help eliminate shadow losses due to the frame and thus add to overall solar module output. FIG. 4B depicts a similar cross-section of a solar module with a frame 30 that might produce a more extreme shading effect on the back side of the solar module 20. FIG. 4C depicts a front view of a solar module 20 with reflective tapes 10 formed around the gap along edges of the solar module 20 between the outer most cells 22 and the frame 30.

Figure 5:
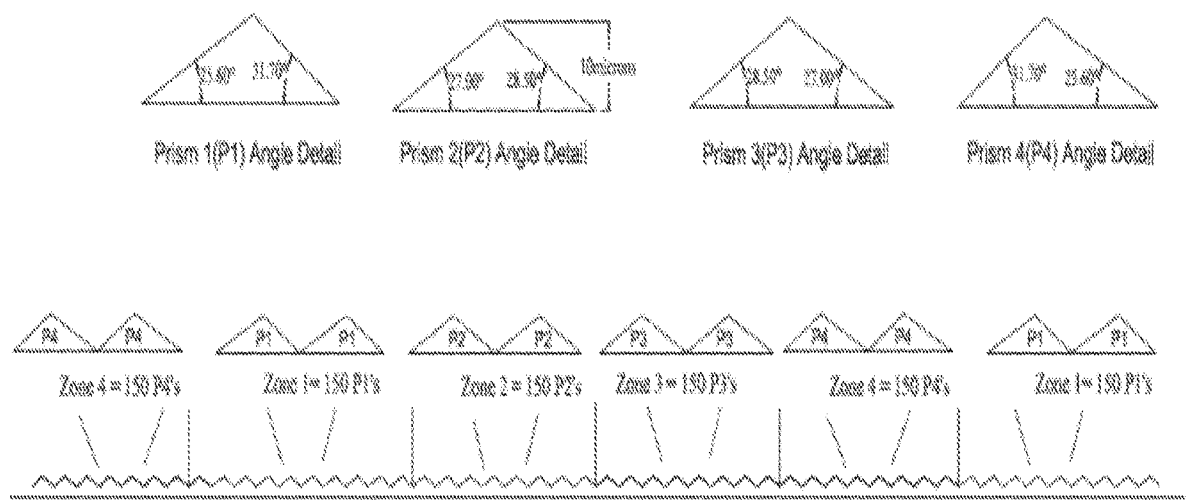
FIG. 5 depicts a micro-structured reflective tape of the present disclosure with zones of different angles of reflection.

FIG. 5 depicts a further aspect of the present disclosure. Specifically, FIG. 5 shows an arrangement of the prisms 14 on the reflective tape 10 that includes different zones where each zone has different attributes for the prisms 14 formed therein. As shown, all prisms have the same basic shape (e.g., triangular) and have a common height, (e.g., 10 mm). However, the angles of the prisms 14 may vary from zone to zone. By having the prisms 14 have the same attributes within a zone, manufacturing costs can be reduced by reducing the tooling requirements. Further, each zone can be designed to perform light redirection independent of other zones. For instance a zone located on the edge of the reflective tape 10 can consist of one prism with one facet angled to redirect light directly onto the back of one of the bifacial cells, the other facet can direct light to TIR off the front glass surface to either the front surface of another bifacial cell or to TIR again off the rear surface of the back glass back onto the rear of the other bifacial cell. Combinations of these zones can be used to fully recover light lost due to gaps between cells, frame edges, j-boxes, module center areas, and other features of the solar module.

Figure 6A:
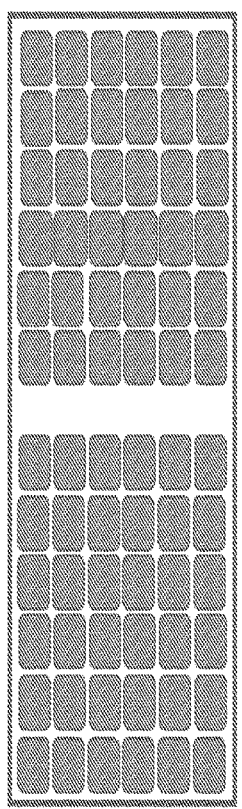
FIGS. 6A-6D depict a variety of solar modules in accordance with the present disclosure.
Figure 6B:
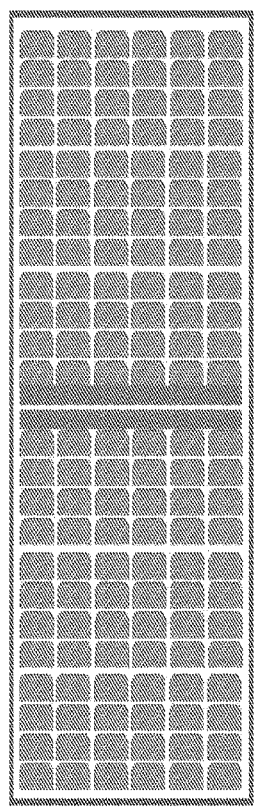
Figure 6C:
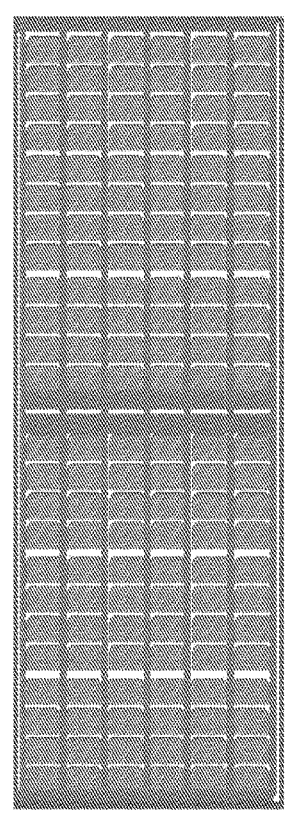

FIGS. 6A-C depict solar modules were a gap intentionally added to the center of the module dividing into halves. This gap may be formed in a single module as depicted here or may be the result of two smaller modules being used. Generally, the gap aligns with the support structure for the modules which, like the frame, produce shading of the module rear side causing shading and loss of potential power output. By adding the gap and reflective tape 10 as depicted in FIG. 6B in the center region, sunlight is reflected into the solar cells 22 of the solar module 20. This results in a general power output increase because of the backsides of the solar cells 22 receiving greater solar energy potentially at a very low cost.

Figure 6D:
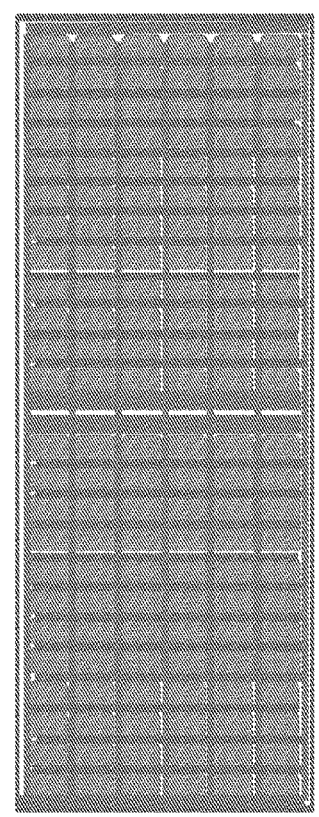
Figure 7A:
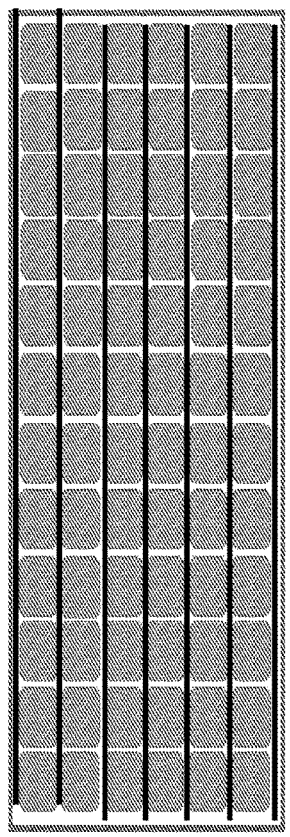
FIGS. 7A-7C depict a variety of solar modules in accordance with the present disclosure.
Figure 7B:
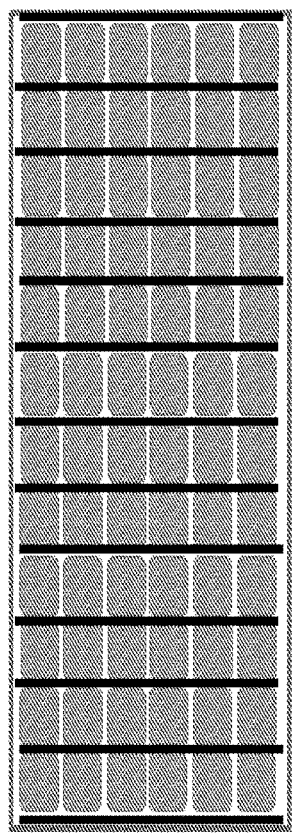
Figure 7C:
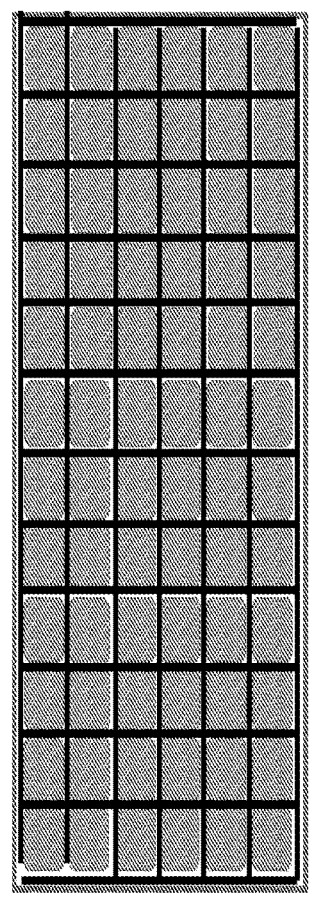

FIGS. 6B and 6C depict a further aspect of the present disclosure using half cells. That is, the standard solar cells 22 as depicted in FIG. 6A can be cut in half. As is known each solar cell outputs the same voltage regardless of its size. Current output is a function of the surface area of a solar cell and the amount of solar radiation it can absorb. As depicted in FIGS. 6B and 6C the overall output power increases even though the surface area of the solar cells, now cut in half, is essentially the same as what is shown in FIG. 6A. Further, by adjusting spacing and utilizing more reflective tapes, the output of the solar module in FIG. 6C can exceed that of FIG. 6B without the addition of more solar cells, which are the primary cost in the solar module manufacturing process. FIG. 5 shows an example of combining various tapes to loss areas to recover light from several loss areas. This can lead to maximum power output compared to modules not including tape enhancement. Further the expectation would be that the solar module of FIG. 6D would have an even greater output than FIG. 6C as the reflective tapes 10 are in both vertical and horizontal directions, thus further maximizing the reflective the potential output. FIGS. 7A-7C depict similar arrangements to FIGS. 6A-6D using reflective tapes 10 in the gaps between cells and between the cells and the frame of the solar module.

In general, it has been calculated that a monofacial solar module such as that depicted in FIG. 6A will have an output of about 360 W. By making the same module bifacial, an increase of 30 W to 390 W can be expected. A full cell bifacial module using reflective tapes as depicted in FIG. 7B might is a further increase to about 400 W. And a solar module having the configurations of FIGS. 6C and 6D can expect to have an output of 430 and 450 W, respectively.

As noted above FIGS. 6B-6D utilizes cells formed from cut whole cells. Cut cells are becoming more popular to reduce current and resistance losses. Modules built from half cells are utilized to create modules which are divided into halves as in the center gap modules of FIGS. 6A-6D. The use of cut cells may afford the intentional use of gaps between cells to increase the proportion of reflective tape to cells. Since the reflective tape 10 is much lower in cost than cells, there is great potential to reduce the overall cost of solar power. At the very least a combination of half cells with a center gap, edge tape and recovery from other cell gaps has the potential to produce the most powerful module available at significantly reduced cost, as noted above with reference to FIG. 6D.

Figure 10:
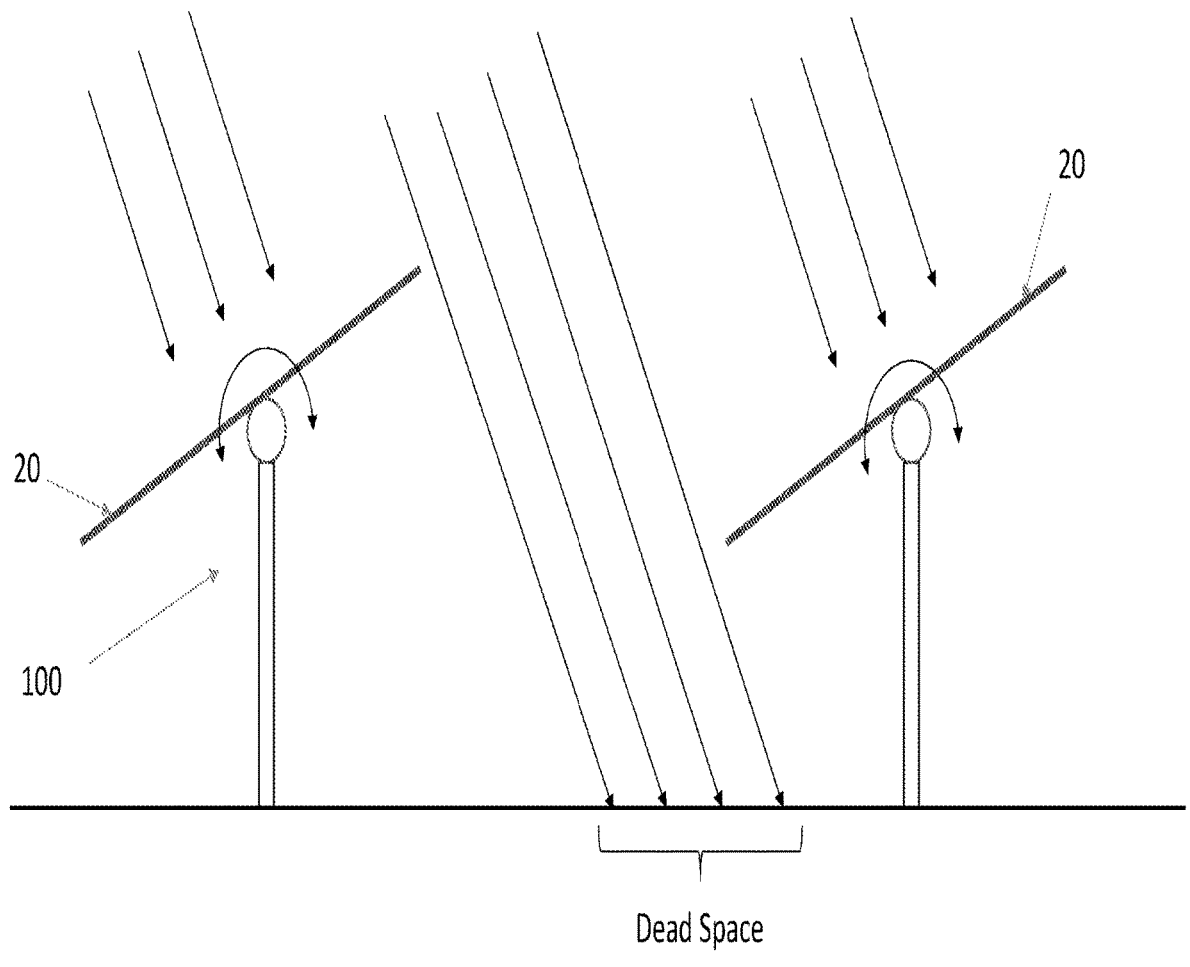
FIG. 10 depicts a linear tracking solar array with dead spaces between rows and random light collection.

In addition to the foregoing, the present disclosure contemplates placement of a reflective tape or other triangular reflective structure, directly on a torque tube of a solar tracker (e.g., as seen in FIG. 10). As noted in FIGS. 6A-6D, the center of a bi-facial solar module is often without solar cell coverage, placement of an triangular shaped or a reflective prism tape 10 directly on the torque tube, approximately 2 inches from the solar module, can effectively reflect much of the light which passes through the solar module, and is not captured, back to both sides of the solar cells. Some portion will be reflected to the rear side of the solar cell and some will be reflected to the front glass and be captured via TIR. Further some of the sunlight may be reflected to neighboring solar modules on separate trackers (i.e., reflection both east and west from the triangular reflector.

Figure 8:
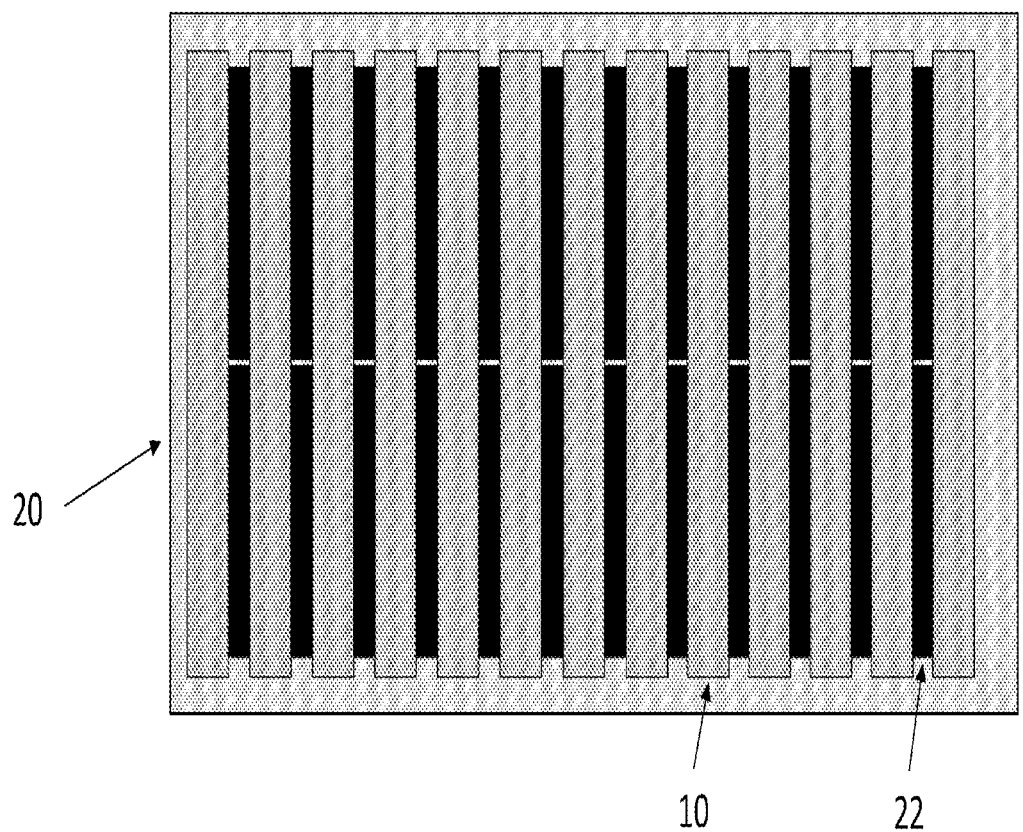
FIG. 8 depicts a solar module in accordance with another aspect of the present disclosure.

A further variation of this can be seen in FIG. 8 where, the prisms 14 on the reflective tape can be arranged with the proper side angles (see FIG. 5) of between 44.5 and 1 degree to allow gathering from over one fourth of a cell width depending on glass thickness. This allows the construction of modules 20 using quartered cells with gaps between the cells large enough to produce a net concentration ratio greater than 1. For example, cells with dimensions of 39 mm×156 mm arranged with gaps of 39 mm between cells (perhaps in a linear arrangement) with films of 39 mm in width to fill the gaps can produce a module with a ratio of 1.8 or more depending on the optical efficiency of the cells. This can produce a solar module of lower cost and enough power to lower the cost per Watt of the module by 10% or more.

In one embodiment the width of the cells is approximately the same as the reflective tapes 10, this ratio of tape 10 to cell 22 width produces a concentration of light onto the cells of between 1.1-5× depending on widths. Cells can be cut along both dimensions with tapes running in both width and length directions to further increase concentration.

Figures 9E, 9F:
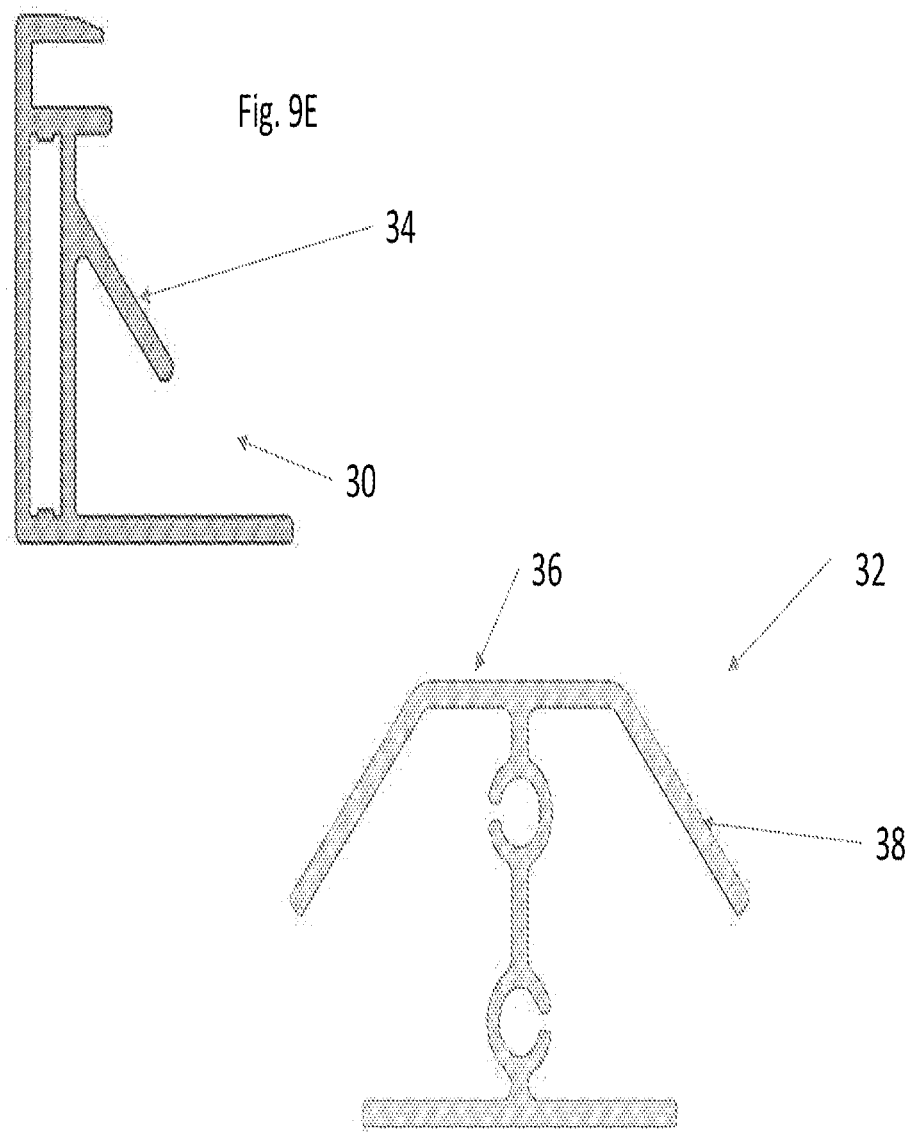

A further aspect of the present disclosure can be seen with reference to FIGS. 9A-9F and relate to a solar module 20 with reflective attributes built into the solar module frame. FIG. 9A depicts a front perspective view of a solar module 20 having a frame 30 and a plurality of solar cells 22. Though shown here as full cells, half, quarter, $1/3^{rd}$, $1/5^{th}$, $1/6^{th}$ and other dimensions may be employed without departing from the scope of the present disclosure. FIG. 9B depicts the backside of the solar module 20. A support 32 can be seen extending between two sides of the frame 30 along the mid-line of the solar module 20. As will be explained in greater detail below the support 32, functions similarly to the reflective tapes 10 described elsewhere herein.

FIG. 9C depicts a cross-sectional view of the solar module 20, and particularly of the frame 30. As can be seen in FIG. 9C, a projection 34 extends from the frame. The projection 34 may be polished aluminum or other material from which the frame 30 is formed. The projection 34 extends from sidewall of the frame 30 at an angle to the sidewall. This angle of the projection relative to the may be between 1 and 80 degrees, 5 and 75 degrees, 10 and 70 degrees, 15 and 65 degrees, 20 and 60 degrees, 25 and 55 degrees, 30 and 50 degrees, 35 and 45 degrees, and 40 and 45 degrees.

In one embodiment the projection extends from the frame at about a 45-degree angle. As with the reflective tape 10 described above, sunlight passes through the gaps 35 between the solar cells 22 and the frame 30 and impact the projection. The sunlight is then reflected either onto the underside of the solar cells 22 or back into the top glass to be reflected onto the front surface of the solar cell 22 by TIR. As will be appreciated, reflective strips 10 may also be employed in other gaps in conjunction with the projections 34.

FIG. 9D depicts a cross sectional view of the support 32 extending from an interior surface of the frame 30. The support 32 has a generally trapezoidal shape with a flat top surface 36 and two side walls 38. Both the top surface 36 and the sidewalls 38 are employed to reflect the sunlight that passes through the gap 37 formed in the center of the solar module 20 onto the solar cells 22. The support 32 performs two functions, first the flat top surface 36 and the two angled side walls 38 serve to reflect light either back into the bottom surface of the solar cells 22 or up through the glass of the solar module 20 to be reflected on to the top surface of the solar cells 22 because of TIR. Secondly the support 32 provides additional stiffness for the solar module 20. This additional stiffness is becoming necessary as solar module manufacturers reduce the size and stiffness of the frames 30 of the solar modules 20 to reduce costs. Further, if desired this support 32 could be retrofit into existing solar modules to provide the reflective functions.

FIGS. 9E and 9F depict the frame 30 with projection 32 and the support 34 with its generally trapezoidal cross-section. The sloping sides of the support may have a similar angular orientation to those described above with respect to projection 32. As noted above, the projection 32 and the support 34 may be aluminum and may be polished or painted to enhance its reflectivity.

A further aspect of the present disclosure is described herein with respect to FIGS. 10-16. FIG. 10 depicts two a single axis solar module tracking arrays 100. The axis of the tracking systems (about which the solar modules 20 rotate) is generally aligned in a north/south (polar axis) while the solar modules 20 are rotated about the axis through a fixed angle range during the course of a day. In the case of bifacial solar modules, diffuse radiation from the surrounding area provides additional power through reflections off ground features. Due to the random nature of the reflections only a small portion of the reflected light is returned to the panel for conversion and much of sunlight impacts so called "dead zones" which return no light to the solar modules.

FIGS. 11A-F depict two embodiments of the present disclosure showing a metalized mirror film 102, having a thickness of between 5 and 100 microns. In one example the film 102 has a thickness of 50 microns. The film 102 may be made of biaxially-oriented polyethylene terephthalate (Bo-PET) commonly sold under the tradename MYLAR® and arranged with moving vertices that can change the slope and shape of the metalized or mirror surface to provide maximum reflection to the bifacial cells 22 of the solar module 20 as the solar module 20 tracks the sun during the day. The low-cost material and supporting structure and can be mechanically or electrically tied to the solar tracker 100 to synchronize mirror shape with solar light incidence angle.

Figure 11A:
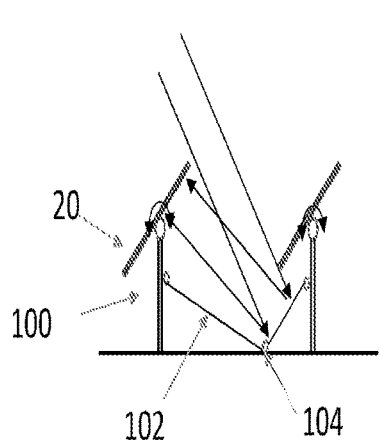
FIG. 11A-11F depict a flexible reflective arrangement in accordance with the present disclosure.
Figure 11B:
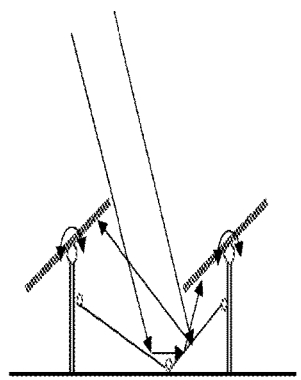
Figure 11C:
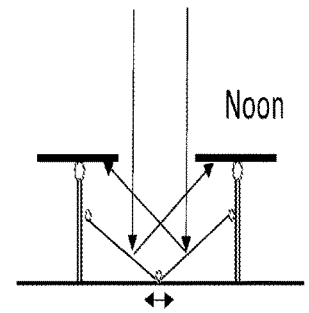

FIGS. 11A-11C depict a system with a movable lower vertex 104. In this scenario the film 102 is rigidly attached to the trackers 100. By moving the location of the lower vertex as the angle of incidence of the sub changes, the reflection of the sunlight also changes. In FIG. 11A, which is closer to either a sunrise or a sunset position, the reflected light is directed into the backside of the left most tracker 100 and the bi-facial solar modules 20 associated therewith. As the trackers 100 move to the position seen in FIG. 11B, the movement of the lower vertex 104 opposite the direction of movement of the sun changes the angle of reflection of the sunlight and results in both trackers 100 receiving reflected light on the underside of the solar modules 20. In FIG. 11C the solar trackers 100 arrive at the noon position, with the sun directly overhead. As a result, the reflected sunlight is equally shared between the two solar modules 20 of the two trackers 100.

Figure 11D:
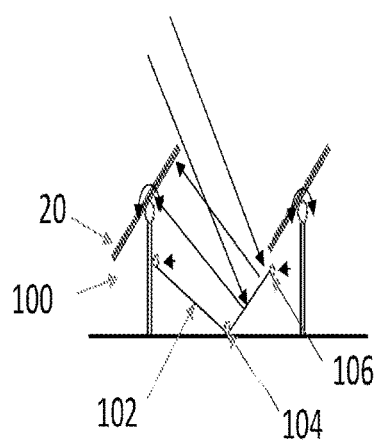
Figure 11E:
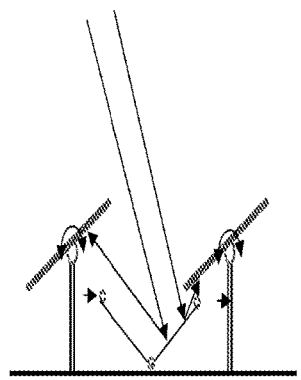
Figure 11F:
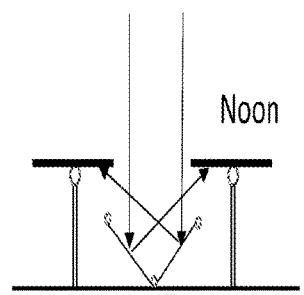

In a different embodiment, depicted in FIGS. 11D-11F, the lower vertex 104 is held in place and does not move as the solar panels 20 are rotated by the tracker 100. Instead the upper vertices 106, which are maintained at a constant distance from each other, are moved to ensure reflection of the sunlight into the backsides of the bi-facial solar modules. Again, at the noon position as seen in FIG. 11F, the reflection is equally reflected into the two trackers 100, and particularly their solar modules 20. Alternatively, both the upper vertices 106 and the lower vertex 104 may be movable. Still in a further embodiment, where both the upper and lower vertices are movable the distance between them may be variable. In some embodiments, a tension roller (not shown) or other means is used to feed and retract film as necessary to maintain constant tension and mirror shape throughout the daily cycle.

Figure 12:
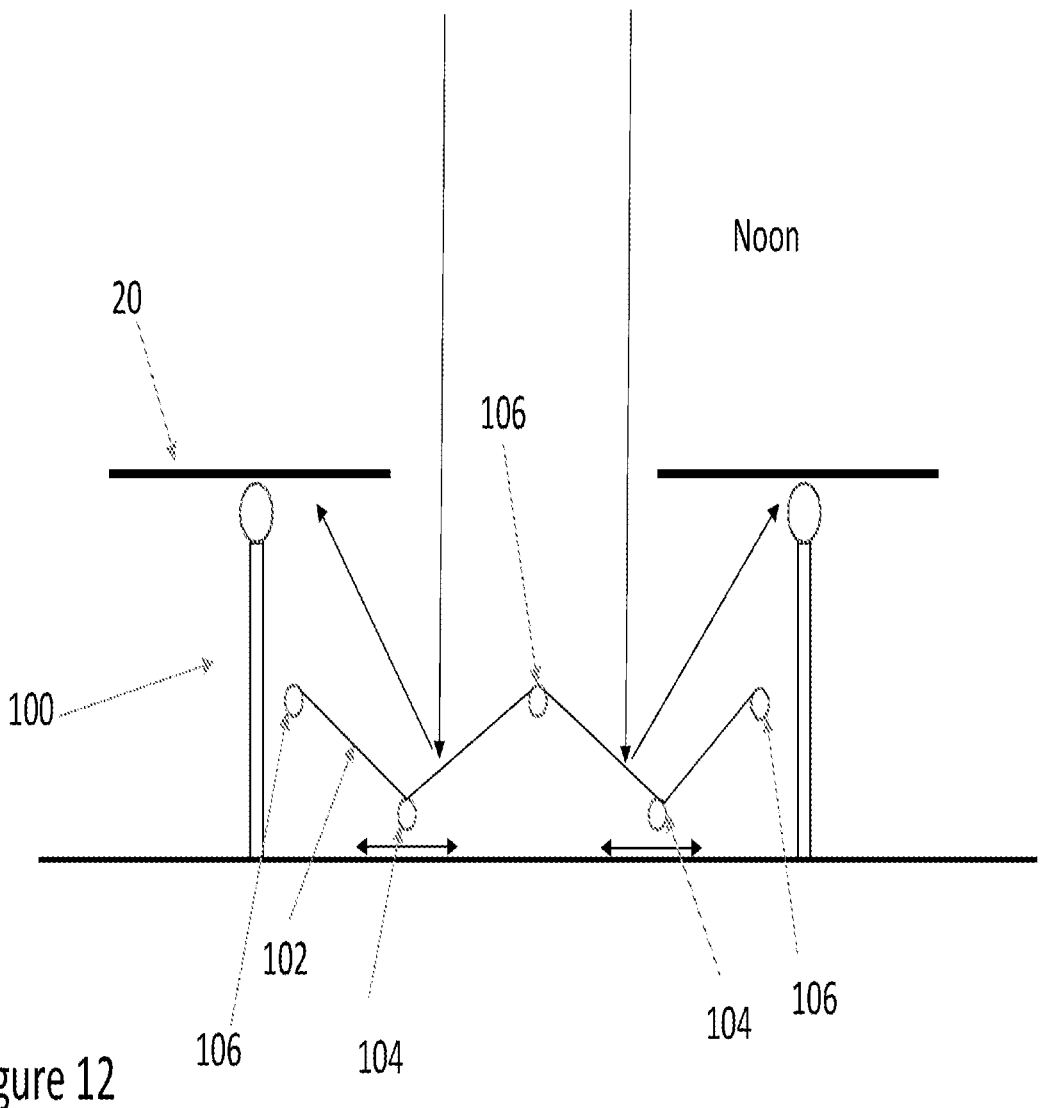
FIG. 12 depicts a multi-vertex flexible reflective arrangement in accordance with the present disclosure.

FIG. 12 is another embodiment of the present disclosure in which an additional upper vertex 106 and an additional lower vertex 104 are employed to span larger distances. Generally, one set of vertices is enough for solar trackers tracking +/−50 degrees, however, in some instances, either with irregular spacing or where larger tracking angles are employed, more than one set of vertices may be employed as shown in FIG. 12. The variations with respect to which vertices 104 and 106 are movable or fixed described above may also be employed in the multiple vertex scenario depicted in FIG. 12.

FIGS. 13-14 depict a variety of mechanisms to enhance the yield of a solar array employing the reflective materials to re-direct solar energy back towards the solar panels. The mechanisms are located on either side of the tracker 100 depending on the orientation of the solar modules 20 on the trackers 100.

Figure 13A:
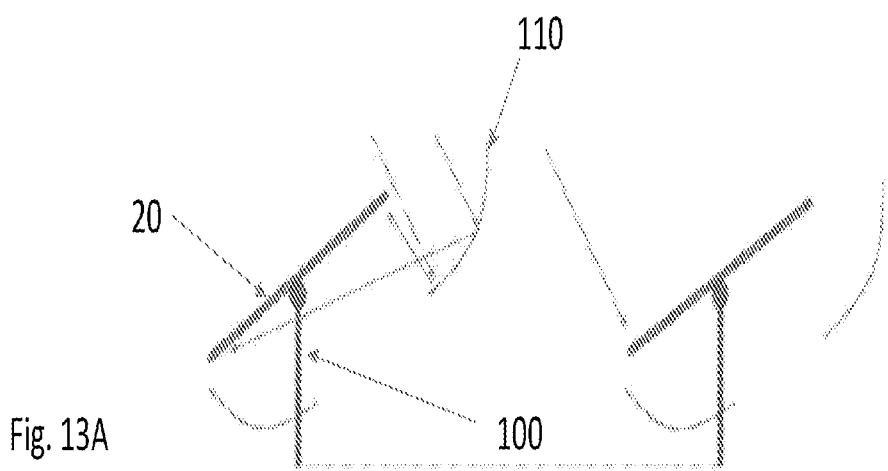
FIG. 13A depicts a full parabolic system for reflecting light to the back side of a bi-facial array in accordance with the present disclosure in a first orientation.
Figure 13B:
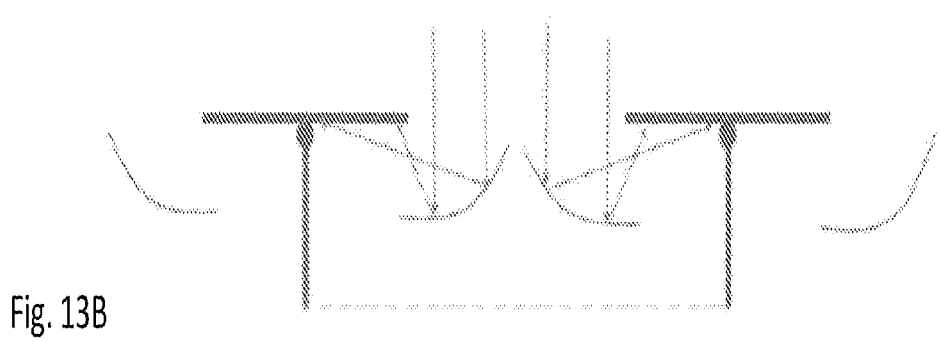
FIG. 13B depicts a full parabolic system for reflecting light to the back side of a bi-facial array in accordance with the present disclosure in a second orientation.

In the embodiment of FIGS. 13A and 13B, each tracker 100 is fitted with at least one parabolic reflector 110. The reflector 110 redirects sunlight into the backside of the solar modules 20 supported by the tracker 100. As can be seen in the progression from FIG. 13A to 13B, as the tracker reaches a noon position, in FIG. 13B, the reflectors 110 are positioned on either side of the tracker 100 such that both left and right sides of the solar module 20 receive reflected sunlight. In contrast, in a more angled position, the reflectors 100 may be placed in a more biased positioned where just one of the reflectors 110 reflects sunlight onto the entirety of the solar module 20.

In FIGS. 14A and 14B one or more ground mounted parabolic reflectors 112 may be employed. As can be seen in the progression from FIG. 14A to 14B, when in an angled condition, the reflector 112 re-directs sunlight onto the backside of a single tracker 100 and solar modules 20. However, as the sun approaches its zenith, the parabolic reflectors 112 re-direct sunlight onto both parallel trackers 100 and their respective solar modules 20.

In FIG. 14B a further embodiment is shown whereby the center portion of the parabolic reflector 112 can be replaced by a prism structure 114, not dissimilar to what was described above with respect to FIG. 1, though it may have different dimensions. The prism structure 114 is ground mounted and substantially fixed to the ground between the two trackers 100. Indeed, it is contemplated that the parabolic reflectors 112 may be entirely replaced by a series of prism structures 114 placed on either side of the solar trackers. These prism structures may be formed of nearly any inexpensive base material, including wood, concrete, metals, plastics, etc. and coated with a layer of reflective material such as the BoPET described above.

In the embodiments of FIGS. 13-14 a white fabric may be employed. White fabric results in reflection of light coming around the solar panel and reflect it back up to the solar modules. In some embodiments the fabric is angled. Similarly, in some embodiments, which may be fabric or low-cost plastics, either coated with a metal or uncoated, that are formed into triangular angles that is placed between the solar trackers. For example, the ground mounted prism structure 114 may be replaced by a simple white fabric. While not an ideal solution, a portion of the light reflected will reach the solar modules 20 and this increase power output.

In yet a further embodiment, a single, or multiple, angled device is placed between the solar trackers 100 and may be employed to reflect light back towards the solar modules 20. In one instance the angled device has essentially a triangular shape. The top of the triangle is separated from the solar module 20 by about a foot and has a slope towards the center of the panel at a slope of about 15 degrees (possibly between 5 and 20 degrees). The light striking this front side is reflected into the solar module 20. On the back side of the triangular element there may be a slope of about 65 degrees, this then reflects light striking the backside of the triangular device into the solar panels of the neighboring tracker.

Although embodiments have been described in detail with reference to the accompanying drawings for illustration and description, it is to be understood that the inventive processes and apparatus are not to be construed as limited thereby. It will be apparent to those of ordinary skill in the art that various modifications to the foregoing embodiments may be made without departing from the scope of the disclosure.

We claim:

1. A bifacial solar module, comprising:
   a first transparent support layer and a second transparent support layer;
   a plurality of interconnected bifacial solar cells interposed between the first transparent support layer and the second transparent support layer with gaps between one or more of the plurality of interconnected bifacial solar cells and edges of the first and second transparent support layers, the plurality of interconnected bifacial solar cells having a first side directly exposed to solar radiation and a second side opposite the first side;
   a frame disposed about a perimeter of and supporting the first transparent support layer, the second transparent support layer, and the plurality of interconnected bifacial solar cells;
   a projection disposed on a sidewall of the frame, the projection extending from the sidewall toward an interior portion of the frame and disposed in spaced relation to the second transparent support layer, the projection angled to reflect light such that some of the light reflecting from the projection is absorbed by the first side via internal reflection of the first transparent support layer and some of the light is absorbed by the second side of the plurality of bifacial solar cells; and
   a support disposed coincidentally with at least one of the gaps and disposed in spaced relation to the second transparent support layer, the support including a center portion and a pair of sidewalls disposed at an angle relative to the center portion such that light passing through the second transparent support layer is reflected off of a portion of the support at angles such that some of the light reflecting from the support is absorbed by the first side via internal reflection of the first transparent support layer, and some of the light is absorbed by the second side of the plurality of bifacial solar cells.

2. The bifacial solar module according to claim 1, wherein the support defines a trapezoidal configuration.

3. The bifacial solar module according to claim 1, wherein an outer surface of the support is polished.

4. The bifacial solar module according to claim 1, wherein the support is supported on a portion of the frame, the support disposed at a mid-portion of the frame.

5. The bifacial solar module according to claim 1, wherein the pair of sidewalls are disposed at an angle of between 30 and 50 degrees.

6. The bifacial solar module according to claim 5, wherein the pair of sidewalls are disposed at an angle of between 40 and 45 degrees.

7. The bifacial solar module according to claim 1, wherein the pair of sidewalls project outward and away from the center portion.

8. The bifacial solar module according to claim 7, wherein the pair of sidewalls of the support extend horizontally greater than the at least one of the gaps.

9. The bifacial solar module according to claim 1, wherein the projection is disposed adjacent a gap between the plurality of interconnected bifacial solar cells and the frame.

10. The bifacial solar module according to claim 1, wherein the projection defines an angle relative to the sidewall of the frame selected from the group consisting of generally about 1 and 80 degrees, 5 and 75 degrees, 10 and 70 degrees, 15 and 65 degrees, 20 and 60 degrees, 25 and 55 degrees, 30 and 50 degrees, 35 and 45 degrees, and 40 and 45 degrees.

11. The bifacial solar module according to claim 1, wherein the projection is polished.

* * * * *